United States Patent [19]

Ninomiya

[11] 4,110,745

[45] Aug. 29, 1978

[54] ANALOG TO DIGITAL CONVERTER

[75] Inventor: Yuichi Ninomiya, Kawasaki, Japan

[73] Assignee: Nippon Hoso Kyokai, Tokyo, Japan

[21] Appl. No.: 626,099

[22] Filed: Oct. 28, 1975

[30] Foreign Application Priority Data

Nov. 6, 1974 [JP] Japan .................. 49-127219

[51] Int. Cl.² .......................... H03K 13/175
[52] U.S. Cl. .............................. 340/347 AD
[58] Field of Search ............... 340/347 AD, 347 CC, 340/146.3 AG; 325/38 R

[56] References Cited

U.S. PATENT DOCUMENTS

| 3,159,815 | 12/1964 | Groce | 340/146.3 AG |
| 3,544,779 | 12/1970 | Farrow | 340/347 AD |
| 3,585,631 | 6/1971 | McCown | 340/347 AD |
| 3,597,761 | 8/1971 | Fraschilla | 340/347 AD |
| 3,710,377 | 1/1973 | Guillen | 340/347 AD |
| 3,721,975 | 3/1973 | Brinkman | 340/347 AD |
| 3,815,124 | 6/1974 | Brewer | 340/347 AD |
| 3,846,786 | 11/1974 | Brown | 340/347 AD |
| 3,858,199 | 12/1974 | Neuner | 340/347 AD |
| 3,935,569 | 1/1976 | Marcel | 340/347 AD |

Primary Examiner—Charles D. Miller
Attorney, Agent, or Firm—Stevens, Davis, Miller & Mosher

[57] ABSTRACT

An analog to digital converter used for converting such an analog signal having dc parts of a constant level periodically as a television picture signal, comprising a plurality of comparators comparing the analog signal with several reference voltage levels, and at least one dc clamper clamping the reference voltage levels in relation to the constant dc level contained in the analog signal. Consequently, the influence affected by dc drifts occuring in the signals and circuit elements may be avoided, so that, high exactness of conversion can be obtained. Besides, in a cascade connection of such converters converting respectively differential analog signals delayed successively to successive bits, high bit rate conversion can be performed without use of high speed circuit elements.

6 Claims, 5 Drawing Figures

FIG_3

ANALOG TO DIGITAL CONVERTER

BACKGROUND OF THE INVENTION

1. Field of the Invention

The present invention relates to an analog to digital converter for converting an analog signal, especially, an analog signal having periodically appearing constant dc levels as a television picture signal, to a digital signal with high exactness, and without being affected by dc drift occuring in the signals and circuit elements.

2. Description of the Prior Art

In converting a television picture signal in the form of an analog signal to a digital signal, for instance, to a PCM signal, and then converting again the digital signal received on the receiving side to an analog signal, so as to reproduce television pictures with high quality, it is required that the analog to digital converting speed should be set at 86 Mbits/sec (10.74 MHz, 8 bits/word), for example, as for the present NTSC standard system. This is because one clock interval is about 93 nano seconds, and it is required that there should be 8 bits for each picture element. Besides, so as to prepare the time for holding a sampled signal within such a short interval, it is required that the operating duration of the respective circuit elements be less than 2–3 nano seconds.

Digital circuit elements having such a high operating speed are obtained with the use of high speed logic circuit elements, for instance, ECL (emitter coupled logic type) and others. At present, however, such analog circuits as voltage comparators and others can hardly act with such a high speed when they employ transistors having cut-off frequencies of 5 GHz as discrete elements. Accordingly, the entire equipment becomes unavoidably expensive.

In a feed-back type analog to digital converter, for instance, that shown in "On the Experimental Ultra-High Speed CODEC" ("OKIDEN Review," vol. 37, No. 4, Dec. 1970, pp 48–64), which is produced with the use of discrete circuit elements for converting a television picture signal to a digital signal, such a high speed conversion as mentioned above has been realized. But, it is impossible at present to realize such a high speed conversion with the use of integrated circuit elements in the feed-back type analog to digital converter.

In a cascade type analog to digital converter, which is used in place of the feed-back type, low speed circuit elements can be used for respective converting stages, because the input signal to be converted to a digital signal is serially delayed by delay circuits of the respective converting stages. That is, the cascade type analog to digital converter consists, as shown in FIG. 1, of a specified number of unit converting stages connected in cascade. Each of the unit stages consists of a delay circuit 4 used for adjusting the signal timing by delaying the input analog signal, for example, a television picture signal. The input analog signal is applied to an input terminal 1 so as to be converted to a digital signal, a comparing circuit 2 which compares the input signal with a reference signal and forms a digital signal of "1" or "0" as an output resulting from the comparison, a digital to analog converter 3 which converts the digital signal derived from the comparator 2 to a corresponding analog signal, and an operational amplifier 5 which forms a differential output signal of the input signal derived from the delay circuit 4 and the analog signal derived from the converter 3, as an input signal of the next stage. The digital signal derived from the comparator 2 is also taken from a terminal 6 as an output of this stage through a delay circuit 7.

Although slow speed circuit elements can be used for the cascade type analog to digital converter, it requires delay circuits, operational amplifiers and other circuits having respectively small dc drifts. The dc components of the signals to be treated are varied under the influence of dc drifts in these circuit elements, and consequently the exactness of the action is lowered.

SUMMARY OF THE INVENTION

It is an object of the present invention to realize an analog to digital converter having high exactness without the use of small dc drift circuit elements.

It is another object of the present invention to realize a high speed analog to digital converter, especially of the cascade type, with the use of comparatively low speed circuit elements and without the accompanying effects of dc level drifts being increased by adopting said type.

It is still another object of the present invention to avoid the influence affected by dc drift occuring in circuit elements and input signals of an analog to digital converter by the use of a dc clamping circuit which never deteriorates the signals to be converted, so far as the signals having constant dc levels which appear periodically are concerned.

It is well known that dc clamping of signals having constant dc levels periodically appearing, for instance, a television picture signal, is used for avoiding the influence affected by the variation of dc components of the signals. But dc clamping has such serious defects as the following.

It is difficult to design and adjust a dc clamping circuit without deterioration of picture quality of a television signal transmitted through the clamping circuit. Besides, clamping pulses generated by the clamping circuit are apt to deteriorate the signals to be clamped as the result of leakage.

An analog to digital converter, according to the present invention, wherein such an input signal as a television picture signal and reference signals having successively different levels are respectively compared with each other, and a digital signal is formed as an output resulting from the comparisons, comprises a dc clamping circuit, that is, a dc clamper, which does not clamp the input signal according to the conventional manner mentioned above, but clamps the reference signals in relation to reference dc levels appearing periodically in the input signal, for instance, to a dc level of horizontal synchronizing signals in a television picture signal, so that it is possible to avoid the influence affected by dc drifts occuring in the input signal and circuit elements of the converter.

That is, an analog to digital converter according to the present invention has a distinctive feature in that it comprises the dc clamper mentioned above in combination with comparators, which compare the input signal and the reference signals with each other and form digital signals as outputs resulting from the comparisons.

DESCRIPTION OF THE PREFERRED EMBODIMENTS

An analog to digital converter according to the present invention is preferably used for converting such an analog signal to a digital signal that reference dc levels, for instance, horizontal synchronizing signals of a television signal, are periodically distributed, especially, only on one side of the information signals. According to the present invention, reference signals for comparison are clamped in relation to the reference dc levels contained in the analog signal within the duration of the reference dc levels, so as to avoid the influence of several kinds of dc drifts on the exactness of the conversion.

Figure 2:
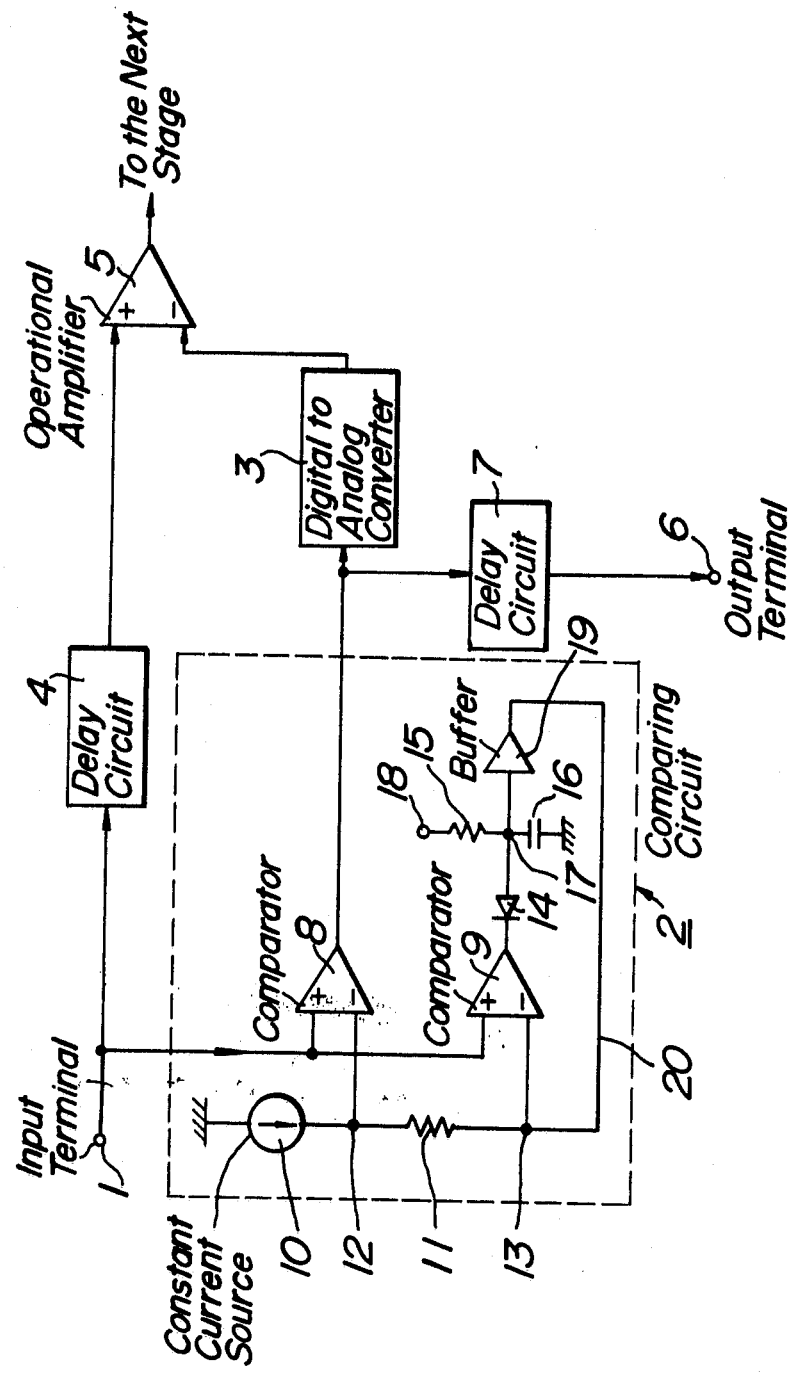
FIG. 2 is a block diagram showing an embodiment of a unit stage of a cascade type converter consisting of analog to digital converting stages according to the present invention for obtaining one bit of a digital signal per stage.

FIG. 2 is a block diagram showing one stage of a preferred embodiment for the use mentioned above, for obtaining one bit of a digital output signal per unit stage of a cascade type analog to digital converter.

Figure 1:
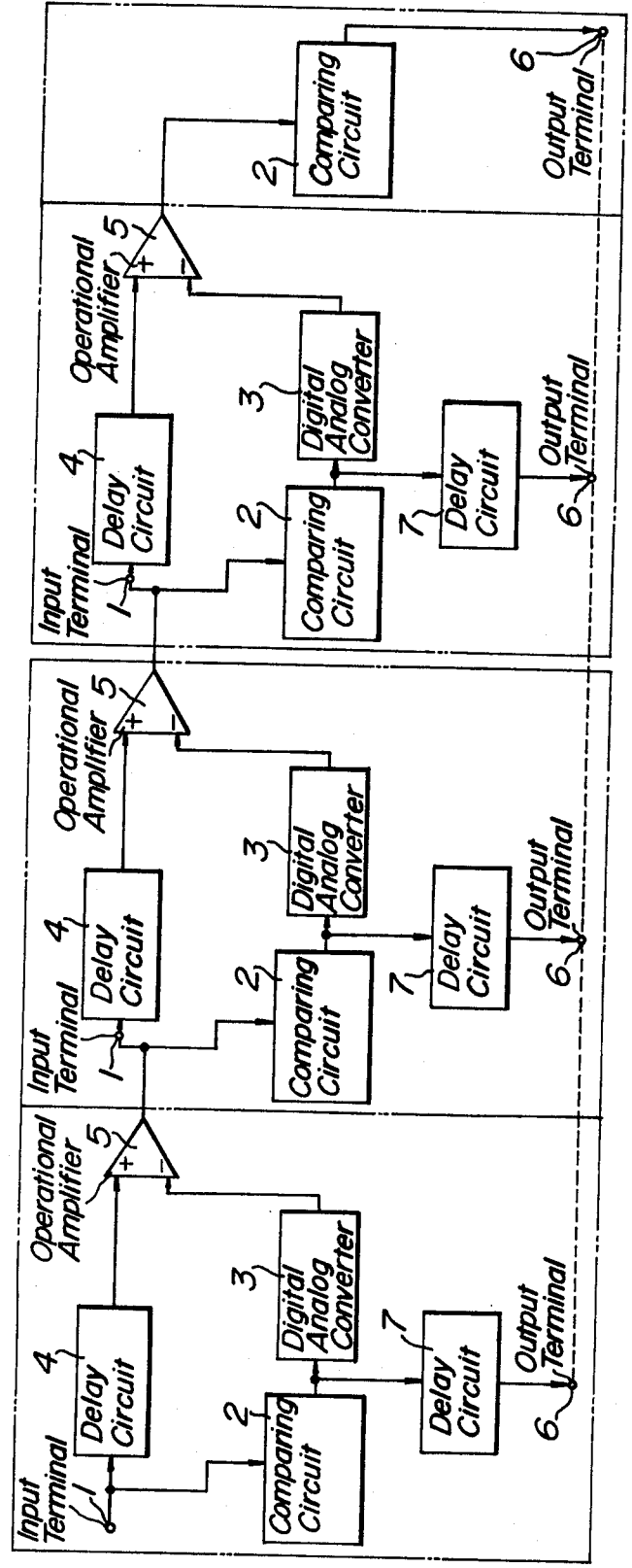
FIG. 1 is a block diagram showing a basic circuit arrangement of a cascade type analog to digital converter.

In the block diagram of FIG. 2, the circuit blocks numbered by FIGS. 1-7 are respectively the same as in FIG. 1, so that, all of these circuit blocks except the comparing circuit 2 are conventional. For instance, the digital to analog converter 3 consists of a voltage divider, and the delay circuit 4 consists of an analog shift-register or an analog memory.

In the cascade type analog to digital converter, converted digital signals can be taken out simultaneously and in parallel with each other from the output terminals 6 of the respective converting stages, wherein one bit of the output digital signal is obtained in response to the successively delayed differential input analog signals from successive stages, so that slow speed circuit elements can be used for conversion.

In the block diagram of FIG. 2, the comparing circuit 2 having the faculty of dc clamping is provided with two comparators 8 and 9. The input terminal 1 is connected commonly to respective first input terminals of the comparators 8 and 9, and the output terminal of the comparator 8 only is connected to the digital to analog converter 3 and also to the output terminal 6 through the delay circuit 7. On the other hand, the comparator 9 and the circuits described below compose the above-mentioned dc clamper in combination with a source of the reference signals for comparison.

The means for supplying the reference voltages for comparison comprises a series circuit consisting of a constant current source 10 and a resistor 11. A terminal 12 of the resistor 11 is connected to the other input terminal of the comparator 8, and the other terminal 13 of the resistor 11 is connected to the other input terminal of the comparator 9. Further, a connecting point 17 of a series circuit consisting of a resistor 15 having a high resistance and a capacitor 16 is connected to an output terminal of the comparator 9 through a diode 14 of reverse polarity. The other terminal 18 of the resistor 15 is supplied with a positive dc voltage, and the other terminal of the capacitor 16 is connected to ground potential. Between the connecting point 17 and the other terminal 13 of resistor 11, a feed-back route 20 is provided through a buffer 19.

The above-mentioned comparing circuit 2 surrounded by a dotted line in FIG. 2 operates as follows when a sample-held television picture signal is applied to the input terminal 1.

The comparator 9 compares the voltage at the top of the horizontal synchronizing signal of the television signal with the voltage appearing at terminal 13 of resistor 11. At this instant, the constant current source 10 supplies the resistor 11 with a current flowing into it, and the voltage appearing at the connecting point 17 of the resistor 15 and the capacitor 16 is held at a constant value because a positive dc voltage is applied to the terminal 18 of the resistor 15. And then, the voltage appearing at the terminal 13 of resistor 11 is equal to the voltage at the connecting point 17, because the buffer 19 has a gain of 1 and a very small dc offset. Before the television picture signal is applied to the input terminal 1, the voltage at the connecting point 17, that is, the voltage at the terminal 13 of the resistor 11 is higher than the voltage at the top of the synchronizing signal of the television picture signal, which has a negative polarity. Thus, when the synchronizing signal of the television picture signal is applied to the input terminal 1, an output signal of "0" is derived from the comparator 9 because the voltage at the terminal 13 of the resistor 11 is higher than the voltage at the top of the synchronizing signal. Therefore, a forward voltage is applied between both terminals of the diode 14, so that the diode 14 becomes conductive. Consequently, the electric charge stored in the capacitor 16 flows into the comparator 9 through the diode 14, and then, the voltage at the connecting point 17 drops. Accordingly, the voltage at the terminal 13 of the resistor 11 drops too. As soon as the voltage at the terminal 13 becomes lower than the voltage at the top of the synchronizing signal of the input television picture signal, an output signal of "1" is derived from the comparator 9. Consequently, the diode 14 is cut-off, and then the capacitor 16 is charged by the dc voltage applied to the terminal 18. But, the charging of capacitor 16 is performed very slowly, because the resistance of resistor 15 is very high as mentioned above. Therefore, the voltage at the terminal of the capacitor 16, that is, at the connecting point 17 becomes nearly equal to the value to which it is driven when the output signal of "1" has been derived from the comparator 9.

Consequently, the voltage at terminal 13 of resistor 11 also becomes nearly equal to the voltage at the top of the synchronizing signal of the input television picture signal. Until the next synchronizing signal is applied to the input terminal 1, the output terminal of the comparator 9 is continuously in a state of "1" because voltages of the picture information signals of the television signal during this interval are higher than that at the terminal 13 of the resistor 11. So that, in this interval, that is, in the duration of the picture information signals of the television signal, the voltage at terminal 13 of resistor 11 is held at a value nearly equal to the voltage at the top of the synchronizing signals of the television signal. Although it was mentioned in the above explanation that the buffer 19 has a gain of 1 and a very small dc offset, such a restriction for the buffer 19 can be removed, because the loop gain obtained by the feed-back route 20 is very high in the state wherein the diode 14 is conductive.

For the reason mentioned above, the reference voltage for comparison, which appears at the terminal 12 of the resistor 11 and then is applied to the comparator 8, is clamped in relation to the voltage at the top of the synchronizing signals of the input television signal. In the case of a first converting stage of the cascade type analog to digital converter, the clamping dc level of the reference voltage for the comparator 8 should be set preferably at one half of the dynamic range, that is, of the maximum voltage Vm of the television picture signal. When the voltage of the input television picture signal is higher than the reference voltage mentioned above, an output signal of "1" is derived from the comparator 8, and, when the former is lower than the latter, an output signal of "0" is derived. These output signals are taken from the output terminal 6 through the delay circuit 7, and simultaneously are applied to the digital to analog converter 3. A converted output signal of ½ Vm, which is equal to the reference voltage for the comparator 8, is derived from the digital to analog converter 3 in response to the "1" output signal of the comparator 8, which composes the lowest figure of the output digital signal. A converted output signal of 0 volt is derived from the digital to analog converter 3 in response to the "0" output signal of the comparator 8. The television picture signal provided delay by the delay circuit 4 and the output signal of the digital to analog converter 3, ½ Vm or 0 volt, are applied to the operational amplifier 5, and then the difference between these input signals is formed as an output of the operational amplifier 5. This differential output signal is applied to the input terminal 1 of the next converting stage of the cascade type converter.

In the next converting stage, the voltage of the differential output signal derived from the first converting stage is compared with a reference voltage set at ¼ Vm volt, that is, at one half of the reference voltage for the first converting stage. The comparison in response to the reference voltage of ¼ Vm volt is performed in the manner mentioned above with regard to the first converting stage, by setting the values of the resistor 11 and the resistors composing the voltage divider of the digital to analog converter 3 at suitable respective values.

The comparison in response to the respective reference voltages for comparison, ⅛ Vm volt, 1/16 Vm volt, . . . are successively performed by respective converting stages connected in cascade. When the comparison in the last converting stage has been performed, the output signals of the comparators 8 in the cascade converting stages are derived from the output terminals 6 through the delay circuits 7, respectively, so that, respective bits of the digit signal having the form of a binary code can be obtained in parallel as an output of the cascade type analog to digital converter.

Although it was so mentioned that the respective reference voltages for comparison are selected to have successive values of ½ Vm volt, ¼ Vm volt, ⅛ Vm volt, . . . , in setting the gain of the operational amplifier 5 at a value of 1, all of the respective reference voltages can be set at the same value of ½ Vm volt when the gain of operational amplifier 5 is set at a value of 2.

The embodiment mentioned above is in the form of a cascade type converter, so as to enable the use of low speed circuit elements as mentioned earlier. However, if a successively divided stable reference signal for comparison is available, it is possible to form another embodiment of a cascade type converter wherein more than two bits are obtained from each stage, and further in such a case that a digital output signal having a required form can be obtained, it is also possible to form an embodiment wherein all of the bits composing the required digital signal are obtained from one converting stage.

Figure 3:
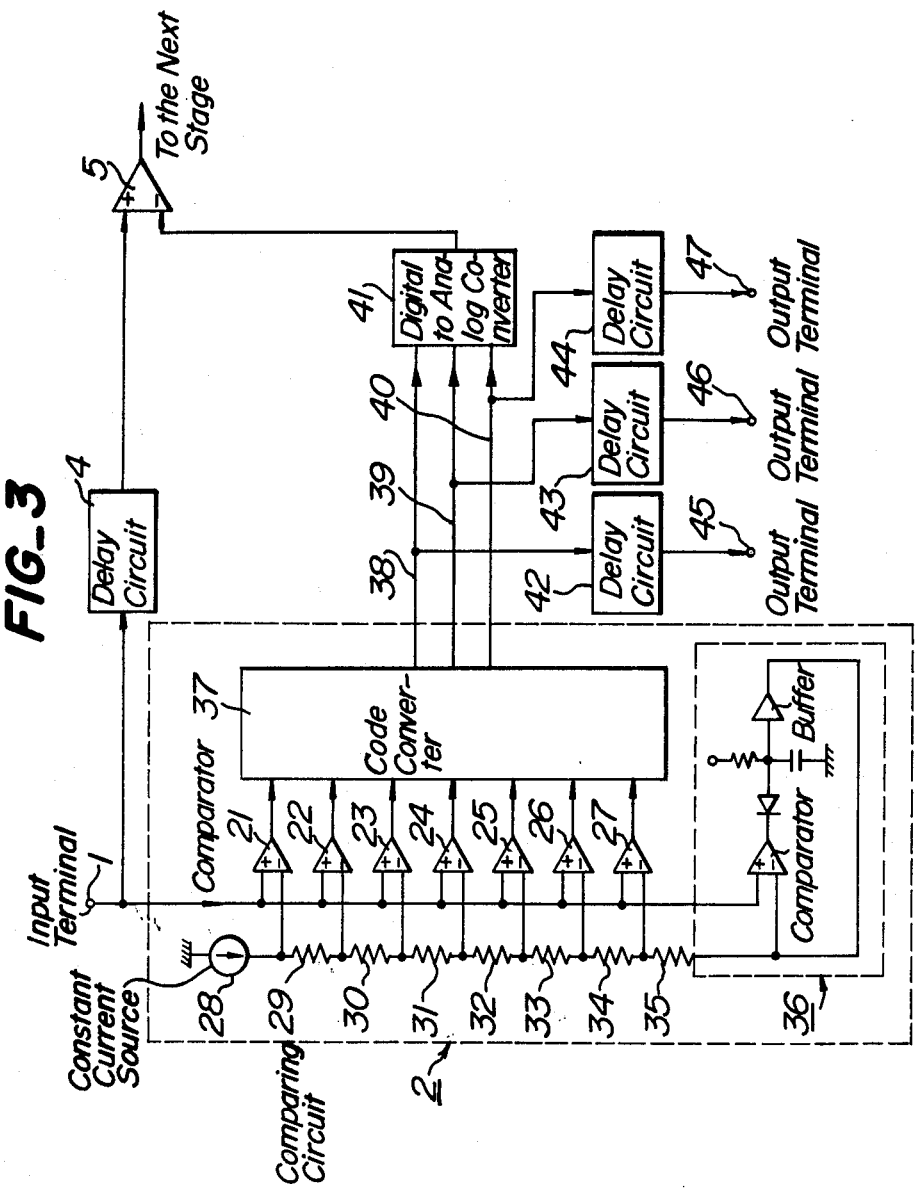
FIG. 3 is a block diagram showing an embodiment of a unit stage of a cascade type converter consisting of analog to digital converting stages according to the present invention for obtaining three bits of a digital signal per stage.
Figure 4:
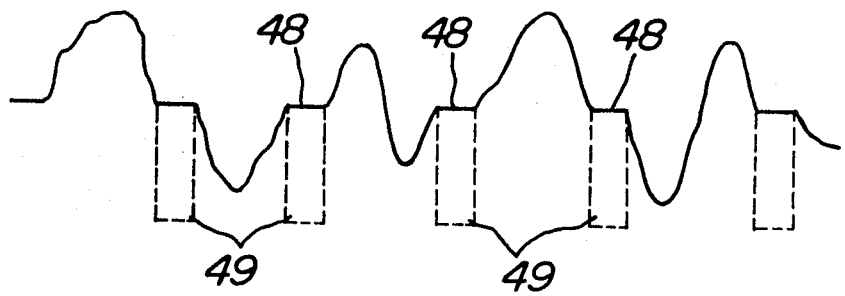
FIG. 4 is an explanatory diagram showing the wave form of a signal having information signals distributed on both sides of constant reference dc levels.

FIG. 3 shows a block diagram of an embodiment of a unit stage of a cascade type analog to digital converter according to the present invention wherein three bits are obtained in one unit stage.

A comparing circuit 2 surrounded by the dotted line in FIG. 3 can be used, of course, for an analog to digital converter for the case in which a required digital signal can be obtained as an output signal. The comparing circuit 2 consists of seven comparators 21-27 arranged in parallel with each other, a series circuit consisting of a constant current source 28 and seven resistors 29-35, a dc clamper 36, and a code converter 37. The dc clamper 36 surrounded by another dotted line in FIG. 3 is composed of the same elements as those shown in FIG. 2. A code converter 37 is connected to a three input digital to analog converter 41 through three connecting lines 38, 39 and 40. These connecting lines 38, 39 and 40 also connect digital output terminals of the code converter 37 to three output terminals 45, 46 and 47 through three delay circuits 42, 43 and 44. Respective reference voltages for the comparators 21-27 have seven successive voltage levels. These seven voltage levels divide the dynamic range of the input signal by 8 divisions. These reference voltages are formed by a series circuit consisting of the constant current source 28 and the seven resistors 29-35, and then are applied respectively to the corresponding comparators 21-27. These reference voltages for comparison in this embodiment are also clamped in relation to a voltage having dc levels periodically appearing in the input signal, for instance, in relation to the voltage at the top of the synchronizing signal of the television signal, which has a constant reference dc level as mentioned above. When a television picture signal is applied to the input terminal 1, the comparators 21-27 compare the voltages of the input television picture signal with the respective reference voltages, and form an octonal code output signal for one figure. The code signals derived from the comparators 21-27 are applied to the code converter 37, and then are converted to a binary code signal of three figures. The code converter 37 is so well known that an example is shown in the Application Note (311, Feb. 1973, p. 6) of Fairchild Co. as an application for a high speed analog to digital converter. In case of using this embodiment for a cascade type converter, the binary code signal derived from the code converter 37 is applied to the digital to analog converter 41, and then is converted to a voltage having a corresponding analog level. The voltage derived from the digital to analog converter 41 and a corresponding part of the input television picture signal provided delay by the delay circuit 4 are applied to the operational amplifier 5, and then, a differential output signal between these signals, which is derived from the operational amplifier 5, is applied to the next converting stage as an input signal, in the same manner as in the preceding embodiment. On the other hand, the three bits of a natural binary code output signal are obtained in parallel respectively from the output terminals 45, 46 and 47 through the delay circuits 42, 43 and 44.

The two embodiments mentioned above are applicable when information signals of the input signal to be converted are distributed only on one side of the reference dc levels contained periodically, such as in the television picture signal. In contrast, in the case shown in FIG. 4, wherein information signals are distributed on both sides of the reference dc levels 48 contained periodically in the input signal, the reference dc levels 48 are lowered to dc levels 49 shown by dotted line in FIG. 4, by means of adding dc voltages having a level, which is lower than the lowest dc level of the input signal, to the reference dc levels 48. So that the information signals are distributed only on one side of the newly lowered reference dc levels. Consequently, the embodiments mentioned above can be used in the latter case.

Figure 5:
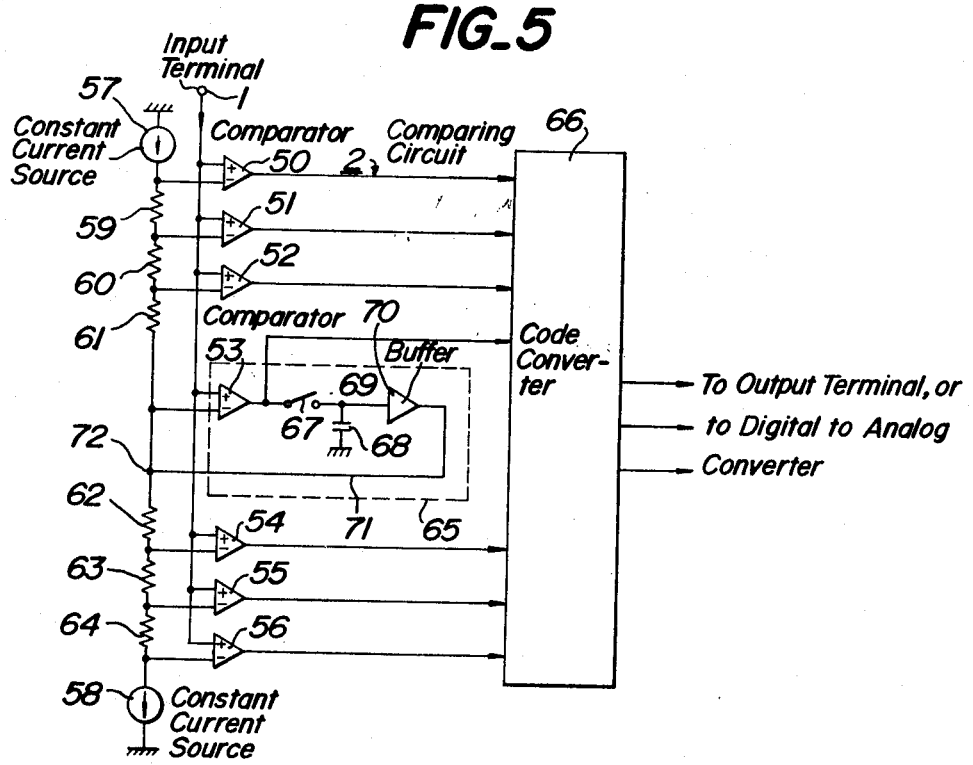
FIG. 5 is a block diagram showing another embodiment of a unit stage of a cascade type converter consisting of analog to digital converting stages according to the present invention for obtaining three bits of a digital signal per stage.

Further, in the latter case, it is possible to modify the circuit arrangement of the comparing circuit 2 as shown in FIG. 5. FIG. 5 shows a block diagram of an embodiment wherein three bits of a digital signal are obtained from one unit converting stage. In FIG. 5, the comparing circuit 2 consists of seven comparators 50-56 arranged in parallel with each other, a series circuit consisting of two constant current sources 57 and 58 and six resistors 59-64, a dc clamper 65 using the comparator 53 in common, and a code converter 66. The dc clamper 65 is provided with an electronic switch 67 connected in series between an output terminal of the comparator 53 and a terminal 69 of a capacitor 68, the other terminal of which is connected to ground potential. The terminal 69 of the capacitor 68 is connected to a connecting point 72 between the resistors 61 and 62, through a buffer 70, which composes a feed-back route 71.

Reference voltages in the embodiment shown in FIG. 5 are formed in the same manner as in the embodiment shown in FIG. 3. That is, voltage levels of seven steps dividing the dynamic range of the input signal by eight divisions are formed by the two constant current sources 57, 58 and the six resistors 59-64 connected in series to these sources, and then applied respectively to the corresponding comparators 50-56. In the present embodiment, the reference voltage appearing at the connecting point 72 between the resistors 61 and 62, is clamped at the reference dc levels contained in the input signal.

Then the reference dc level of the input signal is applied to the input terminal 1, the electronic switch is set up in a state of "on" by a keying pulse, which is formed in relation to the reference dc levels appearing periodically in the input signal. In the comparator 53, a reference dc level voltage appearing in the input signal is compared with the reference voltage at the connecting point 72 of the resistors 61 and 62. For instance, in such a case that the former is higher than the latter, an output signal of "1" is derived from the comparator 53. As a result, the capacitor 68 is charged, and then a voltage at the terminal 69 of the capacitor 68 increases. Since the terminal 69 is connected to the connecting point 72 through the feed-back route 71, the voltage at the connecting point 72 also increases. As soon as the voltage at the connecting point 72 becomes higher than the reference dc level voltage levels appearing in the input signal, an output signal of "0" is derived from the comparator 53. At this instant, charging of the capacitor 68 is stopped by breaking the electronic switch 67, and then the voltage at the terminal 69 of the capacitor 68 is held at a constant value. In the case mentioned above, the capacitor 68 is charged slowly, because the output impedance of the comparator 53 and the capacity of the capacitor 68 have large values, so that the charging is repeated in relation to the reference dc levels applied periodically until the voltage at the terminal 69 of the capacitor 68 reaches a constant value, in the manner mentioned above. Since the voltage at the connecting point 72 of the resistors 61 and 62 connected to the terminal 69 through the feed-back route 71 is also held at the constant value, the reference voltages for comparison are clamped in relation to the reference dc level contained in the input signal.

In contrast, when the voltage at the reference dc level of the input signal is lower than the voltage at the connecting point 72, an output signal of "O" is derived from the comparator 53. As soon as the reference dc level of the input signal is applied to the input terminal 1, the electronic switch 67 is set in a state of "on," so that, electric charge stored in the capacitor 68 flows into the comparator 53, and then, the voltage at the terminal 69 of the capacitor 68 drops. As soon as the voltage at the connecting point 72 becomes lower than the voltage at the reference dc level of the input signal, an output signal of "1" is derived from the comparator 53. At this instant, the voltage at the terminal 69 of the capacitor 68, that is, the voltage at the connecting point 72 of the resistors 61 and 62 is held at a constant value, by setting the electronic switch 67 in an "off" state. Consequently, the reference voltages for comparison are clamped as mentioned above.

The comparators 50-56 compare the voltages of the input signal respectively with the reference voltages clamped as explained above, and then, form an octonal output signal of one figure. The code converter 66 convert this octonal signal to a binary code signal of three figures. Consequently, the input signal having information signals distributed on both sides of the periodical reference dc levels can be converted to a digital signal according to the present invention.

As explained above, in the analog to digital converter according to the present invention, the reference signals for comparison are clamped in relation to the reference dc level contained in the input signal to be converted to a digital signal, and then, the comparison treatment for conversion is performed. Thus, in the case of a cascade type analog to digital converter, it is possible according to the invention, to remove the dc drifts occuring in the delay circuits, the operational amplifiers, and other circuits, and besides, avoid the influence of the variation of dc components of the input signal. Accordingly, an analog to digital converter, especially, a cascade type converter, having high exactness can be obtained in accordance with the present invention. Further, in a cascade type converter according to the present invention, the input signals are delayed successively by the delay circuits provided in the respective converting stages so as to synchronize the timing between the input signal and the resultant signal of the comparison, both of which are applied to the operational amplifier. Thus circuit elements having high speed are not required. Consequently, it is also possible to obtain a compact and low cost converter with the use of integrated circuit elements.

The analog to digital converter according to the present invention can be applied not only for use with a television picture signal having synchronizing signals of negative polarity as mentioned above as an example, but, of course, with a television signal having synchronizing signals of positive polarity. This is done by changing the polarities of respective circuit elements and of respective circuit operations. Further, the invention can be used with all analog signals containing periodically constant dc levels which can be used for comparison. For example, when converting an analog signal consisting of audio signals multiplexed by time division to a digital signal, the analog to digital converter according to the present invention can be applied inserting periodically constant dc levels into the analog signal to be converted.

What is claimed is:

1. An analog to digital converter wherein an input analog signal having periodically appearing reference dc levels to be converted to a digital signal is compared with at least one reference voltage to produce at least one digital output signal, said analog to digital converter comprising:
   comparator means having at least one signal comparator for comparing said input analog signal with said reference voltage to form said digital output signal,
   a series circuit having at least one constant current source and at least one resistor connected in series therewith for supplying said reference voltage to said signal comparator, and
   dc clamping means receiving said input analog signal for periodically clamping the level of said reference voltage at a constant dc voltage level related to said reference dc level in the input analog signal, said dc clamping means including
   a clamper comparator for receiving said input analog signal and a clamper reference signal corresponding to said reference voltage for comparing said clamper reference signal with said reference dc level in said input analog signal,
   switching means having a first terminal connected to an output terminal of said clamper comparator,
   a capacitor connected between a second terminal of said switching means and ground, said capacitor being charged or discharged in accordance with the output signal derived from said clamper comparator, and
   a buffer connected between the junction between said capacitor and said switching means and an input terminal of said clamper comparator for supplying said clamper reference signal, said switching means being opened or closed in accordance with the level difference between the output signal derived from said clamper comparator and the voltage at said junction.

2. An analog to digital converter as claimed in claim 1, wherein said switching means consists of an electronic switch controlled by a keying pulse which is formed in relation to the input analog signal.

3. An analog to digital converter as claimed in claim 1 which further includes a dc voltage source coupled to said junction by a resistor having a relatively high resistance, and wherein said switching means consists of a diode.

4. An analog to digital converter as claimed in claim 1, wherein said series circuit comprises a plurality of resistors connected in series for supplying a plurality of reference voltages, said comparator means comprises a plurality of signal comparators provided to receive said input analog signal and a corresponding one of said plurality of reference voltages, and which further comprises a code converter, said converter being coupled to the output terminals of said plurality of signal comparators for converting the output digital signals derived from said signal comparators to a coded signal.

5. An analog to digital converter as claimed in claim 4, further comprising:
   a digital to analog converter for converting said coded signal derived from said code converter to an analog signal,
   delay means for delaying said input analog signal, and
   an operational amplifier for producing a differential output signal between said analog signal derived from said digital to analog converter and a delayed analog signal derived from said delay means.

6. An analog to digital converter as claimed in claim 1, further comprising:
   a digital to analog converter for converting said digital output signal derived from said signal comparator to an analog signal,
   delay means for delaying said input analog signal, and
   an operational amplifier for producing a differential output signal between said analog signal derived from said digital to analog converter and a delayed analog signal derived from said delay means.

* * * * *